United States Patent [19]
Toumazou et al.

[11] Patent Number: 5,352,989
[45] Date of Patent: Oct. 4, 1994

[54] LOW INPUT RESISTANCE AMPLIFIER STAGE

[75] Inventors: Christofer Toumazou, Oxford, United Kingdom; Martin Anding, Los Gatos, Calif.

[73] Assignee: Elantec, Inc., Milpitas, Calif.

[21] Appl. No.: 62,810

[22] Filed: May 11, 1993

Related U.S. Application Data

[63] Continuation-in-part of Ser. No. 41,936, Apr. 2, 1993.

[51] Int. Cl.$^5$ .............................................. H03F 3/30
[52] U.S. Cl. ................................................ 330/265
[58] Field of Search ............... 330/265, 267, 268, 271, 330/273, 274, 288

[56] References Cited

U.S. PATENT DOCUMENTS

| | | | |
|---|---|---|---|
| 5,103,188 | 4/1992 | Bender | 330/267 X |
| 5,179,355 | 1/1993 | Harvey | 330/267 X |

OTHER PUBLICATIONS

D. C. Wadsworth, "Accurate Current Conveyor Topology and Monolithic Implementation", IEE Proceedings, Apr. 1990, Part G, vol. 137, No. 2, pp. 88–94.

I. A. Koullias, "A Wideband Low-Offset Current-Feedback Op Amp Design"; Proceedings of the 1989 Bipolar Circuits and Technology Meeting, Minneapolis, Minn., Sep. 18–19, 1989, pp. 120–123.

A. Payne and C. Toumazou, "High Frequency Self-Compensation of Current-Feedback Devices", 1992 IEEE International Symposium Circuits and Systems, San Diego, Calif., May 10–13, 1992, pp. 1376–1379.

*Primary Examiner*—James B. Mullins
*Attorney, Agent, or Firm*—Leo V. Novakoski; Albert C. Smith

[57] ABSTRACT

An amplifier stage suitable for current conveyors and current mode feedback operational amplifiers has low input resistance and operates at low power. The amplifier stage comprises a buffer having inverting and non-inverting inputs and a pair of current outputs, and a pair of multiple output current mirrors which operate in conjunction with the buffer to generate an output current at a high gain node in response to an input signal applied to the buffer inputs. Each multiple output current mirror has a low impedance current input for receiving current signals generated by the buffer and multiple high impedance current outputs for providing current feedback to the inverting input of the buffer and output current to the high gain node of the amplifier stage. The magnitudes of the feedback and output currents are determined by the resistances of current scaling resistors associated with the low impedance current input and each of the high impedance current outputs.

7 Claims, 4 Drawing Sheets

LOW INPUT RESISTANCE AMPLIFIER STAGE

RELATED APPLICATION

This application is a continuation-in-part of co-pending application, Ser. No. 8/041,936, filed Apr. 2, 1993, entitled "Low Input Resistance Current-Mode Feedback Operational Amplifier Input Stage", the disclosure of which is hereby incorporated by reference.

FIELD OF THE INVENTION

This invention relates to low input resistance amplifier stages, and in particular to low input resistance amplifier stages for use with current conveyors and current mode feedback operational amplifiers.

BACKGROUND OF THE INVENTION

Amplifier stages for current conveyor circuits and current mode feedback operational amplifiers have a number of features in common since current conveyors may be considered as a topological subset of current mode feedback amplifiers. For example, both circuits use current mirrors to generate current signals at a node in response to current signals at an inverting input. For current conveyor circuits, the current signal at the node is the circuit output, and for an ideal current conveyor, the output current is identical to the input current. For current mode operational amplifiers, the current from the high impedance output of the current mirror is applied to an output buffer, and a portion of it is fed back to the inverting input. In both circuits, ideal circuit behavior is approached only where the input resistance of the inverting input is minimized.

In conventional amplifier stages for current conveyors and current mode feedback operational amplifiers, the inverting input is formed by the common emitters of pair of transistors having complimentary conductivity types. The input resistance of the inverting input is the parallel resistance of the emitters of the complimentary transistors. The resistance of each transistor is just the intrinsic emitter resistance, which is approximately equal to 26 ohms per 1 mA of emitter current. For both current conveyor circuits and current mode operational amplifiers, this non-zero input resistance causes the input to deviate from virtual ground, and for current feedback operational amplifiers, it leads to a gain dependence in the closed loop bandwidth, the closed loop transfer function, and the DC closed loop gain.

One solution to the non-zero input resistance of current conveyor and current feedback amplifier circuits is to operate the amplifier stage at high quiescent currents to reduce the input impedance, $R_{in}$. However, this approach increases the quiescent power dissipation of the circuit. Further, in order to preserve the unity current gain of current conveyor circuits, any method used to reduce $R_{in}$ must not introduce differences between the current at the non-inverting input and the current at the high impedance output node.

SUMMARY OF THE PRESENT INVENTION

The present invention is an amplifier stage having a low input resistance inverting input suitable for circuits requiring inputs near virtual ground, such as current conveyors and current mode feedback operational amplifiers. The low input resistance provided by the amplifier stage maintains the inverting input near virtual ground, and in the case of current mode feedback operational amplifiers, reduces the gain dependence of the closed loop bandwidth, the closed loop transfer function, and the DC closed loop gain of the operational amplifier.

The amplifier stage of the present invention uses a current mirror having a low impedance input and multiple high impedance outputs to reduce the input resistance at the inverting input of the stage by means of a local current feedback loop. A feedback current, which is provided to the inverting input through one of the high impedance outputs of the current mirror, reduces the input resistance by a factor related to the current gain of the current mirror. A second output forms the high impedance z-node of the current mirror. An optional third output is available to insure that the current at the inverting input, including the feedback current, is exactly replicated at the high impedance output. This feature is particularly useful for maintaining the unity current gain of current conveying circuits.

The amplifier stage of the present invention may also be provided with a pair of current sources at the low impedance inputs of the current mirror for low power operation. Current from the inverting input is diverted from the input of the current mirror through a current source connected between the inverting input of the amplifier stage and a corresponding supply voltage. By reducing the current supplied to the current mirror, the current sources of the present invention reduce the output current and consequently the power dissipation in the amplifier stage without increasing the input resistance of the inverting input.

DETAILED DESCRIPTION OF THE DRAWINGS

Figure 1:
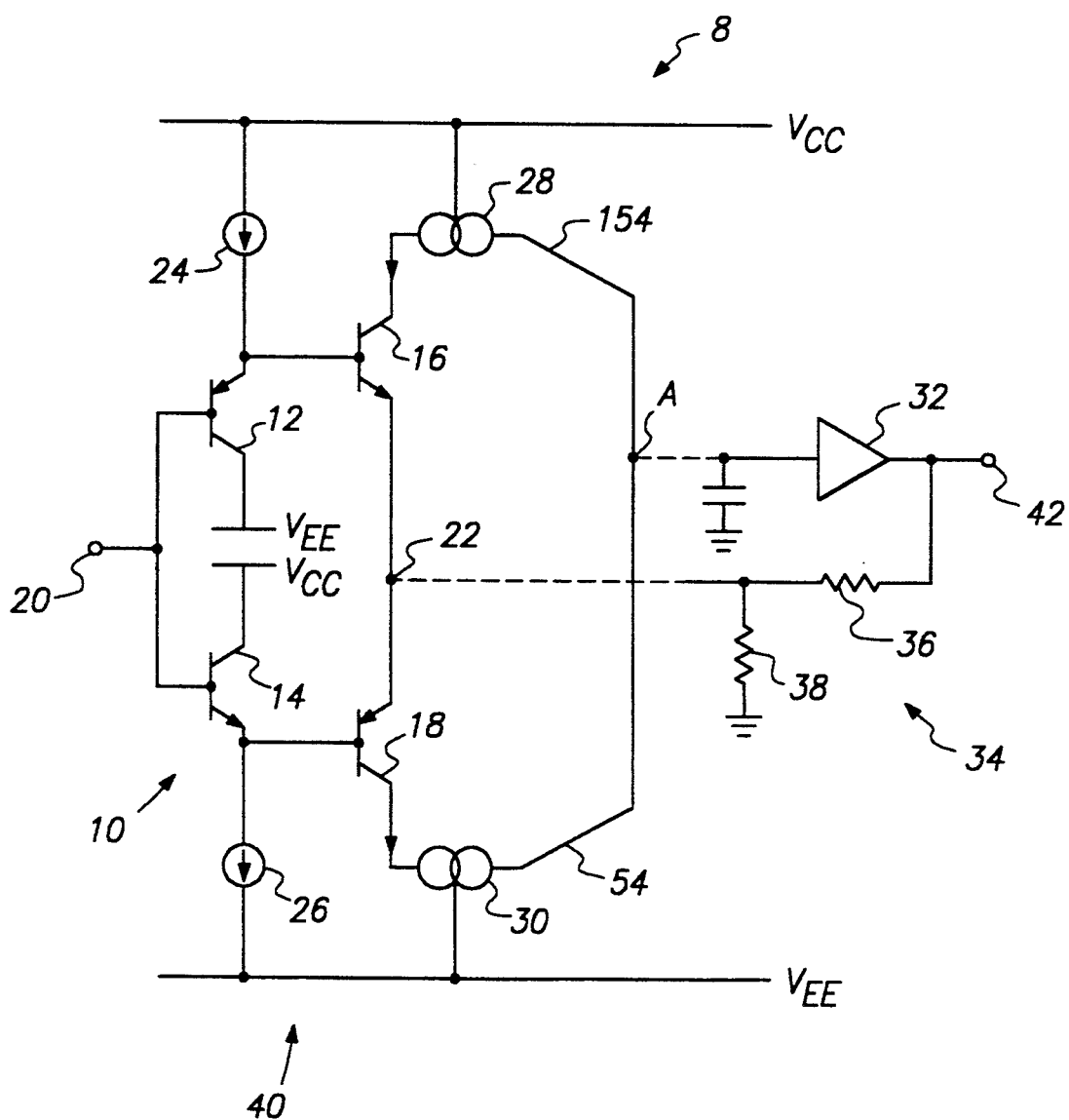
FIG. 1 is a schematic diagram of conventional current conveyor circuit, including the additional connections necessary to convert it to a current mode feedback operational amplifier.

Referring to FIG. 1, there is shown a schematic diagram of a conventional amplifier stage 8 suitable for use with a current conveyor circuit or a current mode feedback operational amplifier circuit. An input buffer 10 comprises a first pair of transistors 12, 14 having complimentary conductivity properties and a second pair of transistors 16, 18 also having complimentary conductivity properties. The bases of transistors 12, 14 are connected together, forming a non-inverting input 20, and the emitters of transistors 16, 18 are connected together, forming an inverting input 22. Current sources 24, 26 provide bias current to transistors 12, 14, 16, 18. Current mirrors 28, 30 provide a replica of the collector current in transistors 16, 18 to point A. Amplifier stage 8 is a current conveyor circuit when an output current is taken from high gain node point A, which is the formed from high impedance outputs 154, 54 of the current mirrors 28, 30, respectively.

A feedback circuit 34 is also indicated in FIG. 1 for converting amplifier stage 8 into a current mode feedback operational amplifier 40. Feedback circuit 34 comprises a feedback resistor 36 and a gain setting resistor 38 connected as a voltage divider between output 42 of output buffer 32 and inverting input 22.

The open-loop input resistance at inverting input 22 is determined by the parallel resistance of the transistors 16, 18, which is just the intrinsic emitter resistance, $R_e$, of these devices. Typically, $R_e$ for a bipolar transistor is approximately $25/I_E$ where $I_E$ is the bias emitter current in milliamps. For example, with an $I_E$ of 1 mA, $R_e$ is approximately 25 ohms, and the input impedance $R_{IN}$ of inverting input 22 is approximately 12 ohms. For typical feedback resistor values of about 1000 ohms, the product $G\, R_{IN}$ becomes comparable to $R_2$ for gains of about 100 or 40 decibels. However, the bandwidth will begin to roll off well before G reaches 40 dB.

Figure 2:
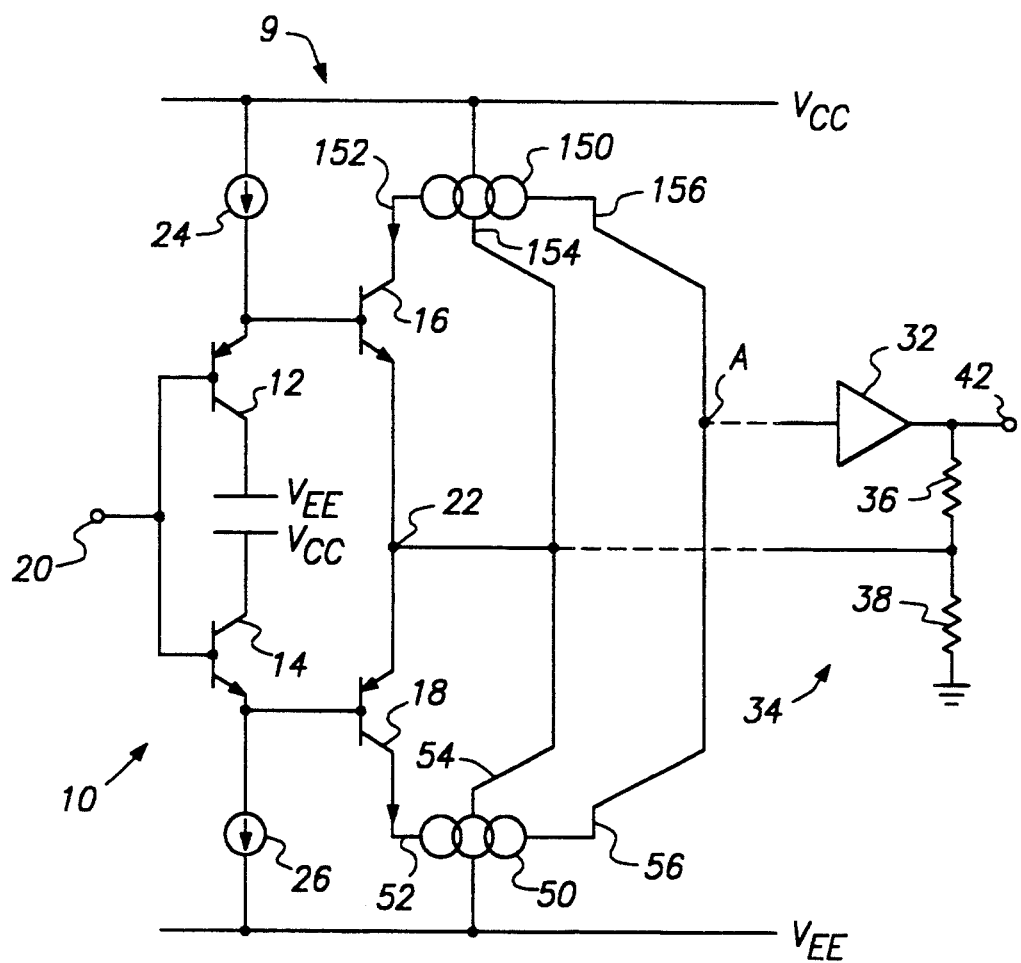
FIG. 2 is a schematic diagram of an amplifier stage for a current conveyor circuit and a current mode feedback operational amplifier in accordance with the present invention.

Referring now to FIG. 2, there is shown an amplifier stage 9 modified in accordance with the present invention. In particular, current mirrors 28, 30 of conventional amplifier stage 8 have been replaced by dual output current mirrors 50, 150. Dual output current mirrors 50, 150, each have low impedance current input nodes 52 and 152, respectively, and a pair of high impedance current output nodes 54, 56 and 154, 156, respectively. In current mirror 50, low impedance current input node 52 is connected to inverting input 22 through transistor 18, while high impedance current node 54 is connected directly to inverting input 22, and high impedance current node 56 is connected to high gain node, A. Similarly, the low impedance current node 152 and high impedance current node 154 of dual output current mirror 150 are connected to inverting input 22, and high impedance current node 156 is connected to high gain node A in a manner corresponding to that of current mirror 50.

Figure 3:
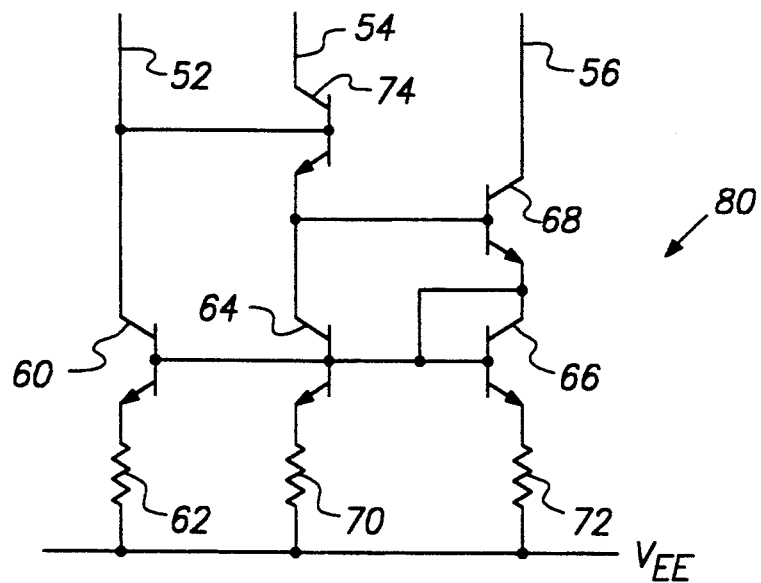
FIG. 3 is a schematic diagram of a dual output current mirror circuit in accordance with the present invention.

Referring now to FIG. 3, there is shown a detailed schematic diagram of a dual output current mirror 50 in accordance with the present invention. A transistor 60 has its collector connected to the collector of transistor 18 of inverting input 22, its emitter connected to supply voltage $V_{EE}$ through a current scaling resistor 62, and its base connected to the bases of transistors 64, 66. The collector of transistor 60 is connected to the base of transistor 74 and forms low impedance current input 52 of dual current mirror 50. Input 52 is driven by the collector current of transistor 18. Transistors 64, 66, 68 are connected as a Wilson-type current mirror 80. The emitters of transistors 64, 66 are each connected to supply voltage $V_{EE}$ through current scaling resistors 70, 72, respectively, and their bases are connected to each other and to the bases of transistor 60. The base and emitter of transistor 68 are connected to the collectors of transistors 64 and 66, respectively. The collector of transistor 68, which is the high impedance current output node of Wilson-type current mirror 80, forms the high gain node of amplifier stage 9 with high impedance current output node 156 of dual output current mirror 150. Transistor 74 has its base connected to the collector of transistor 60, its collector connected to inverting input 22, and its emitter connected to the collector of transistor 64. The collector of transistor 74 forms high impedance current output node 54 and isolates transistor 64 from inverting input 22. Current mirror 150 provides a circuit complimentary to current mirror 50, based on pnp devices.

With dual output mirror 50 configured as above, currents in transistors 74, 68 are determined by the relative sizes of current scaling resistors 62, 70, and 72. For example, where the ratio of resistor 62 to resistor 70 is 1/K:1, currents KI and I are generated at the collectors of transistors 74 and 60, respectively. thus, a signal at inverting input 22 which would generate current KI at the inverting input 22 of a conventional amplifier stage 8, generates a current (1+K)I at inverting input 22 of amplifier stage 9. Accordingly, the input resistance of inverting input 22 with feedback from current mirrors 50, 150 is given by:

$$R'_{in}=K\, R_{in}/(1+K), \qquad\qquad\text{(Eq. 1)}$$

where $R_{in}$ is the input resistance of conventional amplifier stage 8 and $R'_{in}$ is the input resistance of amplifier stage 9 with current feedback. By choosing resistors 62, 70 so that K<1, the input resistance of amplifier stage 9 can be reduces significantly. Further, resistor 72 may be chosen according to the desired output current at high gain node A. Thus, where resistor 72 has the same resistance as resistor 70, the current at high gain node A will be amplified over the current at input 22 by a factor of 1/(K+1). Larger or smaller current gains at high gain node A can be generated by choosing the resistance of resistors 62, 70, and 72 accordingly.

One shortcoming of amplifier stage 9 is that the output current at high gain node A from high impedance outputs 56 and 156 is not equal to the current at inverting input 22. For example, consider the case where the resistances of resistors 62, 70, 72 are in the ratio 1/K:1:1. Any current injected into inverting input 22 is divided between input 52 and output 54 or between input 152 and output 154, depending on the sign of the current, in a ratio of K:1. Meanwhile, the current at output 56 or 156 will be 1, giving a current gain of 1/(1+K) for amplifier stage 9. For small values of K, this deviation from unity current gain will be small, and for typical operational amplifier applications will not be critical. However, current conveyors are open loop devices intended to copy currents from inverting input 22 to high gain node A. and the deviation from unit gain in these circuits is unacceptable.

Figure 4:
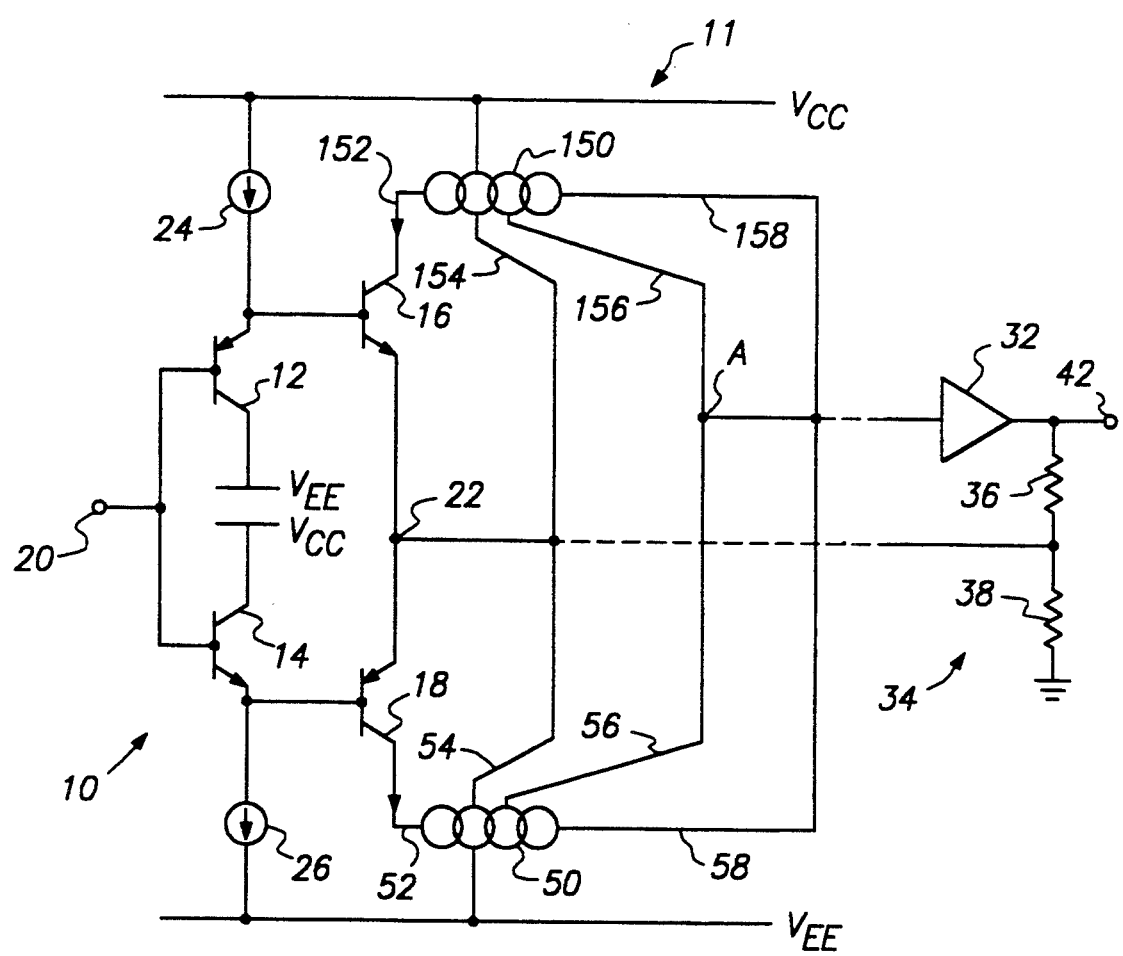
FIG. 4 is a schematic diagram of an amplifier stage having a multiple output current mirror in accordance with the present invention.
Figure 5:
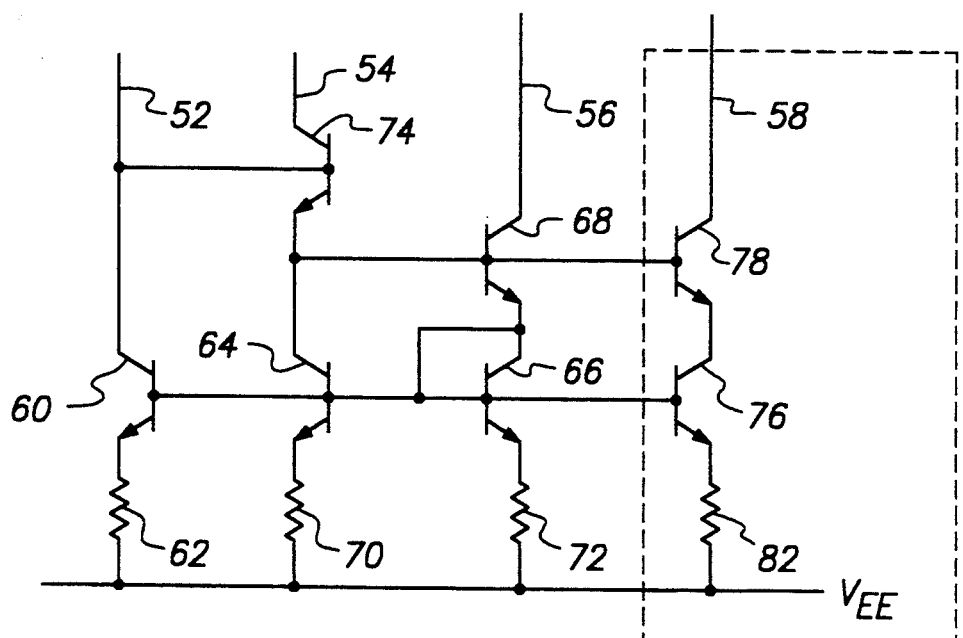
FIG. 5 is a schematic diagram of a multiple output current mirror in accordance with the present invention.

Referring now to FIG. 4, there is shown a modified amplifier stage 11 which is a current conveyor circuit providing unity current gain between inverting input 22 and high gain node A. Amplifier stage (current conveyor) 11 has been modified by adding a third high impedance current output 58 to current mirror 50. Similarly, a third high impedance current output 158 has been added to current mirror 150. Referring to FIG. 5, there is shown a schematic diagram of high impedance current output 58, that replicates high impedance output 56 of current mirror 50. Thus, npn transistor 76 has its emitter connected to supply voltage $V_{EE}$ through current scaling resistor 82. An optional isolation transistor 78 has its emitter connected to the collector of transistor 76 and its collector connected to high gain node A. The base of transistor 76 is connected to the bases of transistors 62, 70, and 72, and the base of transistor 78 is connected to the base of transistor 68. By choosing the resistance of current scaling resistor 82 to be equal to the resistance of current scaling resistor 62, i.e. equal to 1/K times the resistances of current scaling resistors 70, 72, the total output current into high gain node A is increased to 1+K, which is the total current injected into inverting input 22. Thus, input current at inverting input 22 is replicated exactly at high gain node A, giving unity current gain.

For a fixed total current, the power dissipation of the circuits of FIGS. 1, 2, and 4 are comparable, due to the fact that for amplifier stages 9 and 11, the emitter current of transistors 16, 18 are reduced by a factor of K while the input resistance of inverting input 22 is increased by a factor of K/(1+K). Since the intrinsic emitter resistance of transistors 16, 18 depends inversely on the emitter current, the net effect of the new circuit topography is to change the input resistance by a factor of approximately 1/(1+K), when the total current is held fixed.

Figure 6:
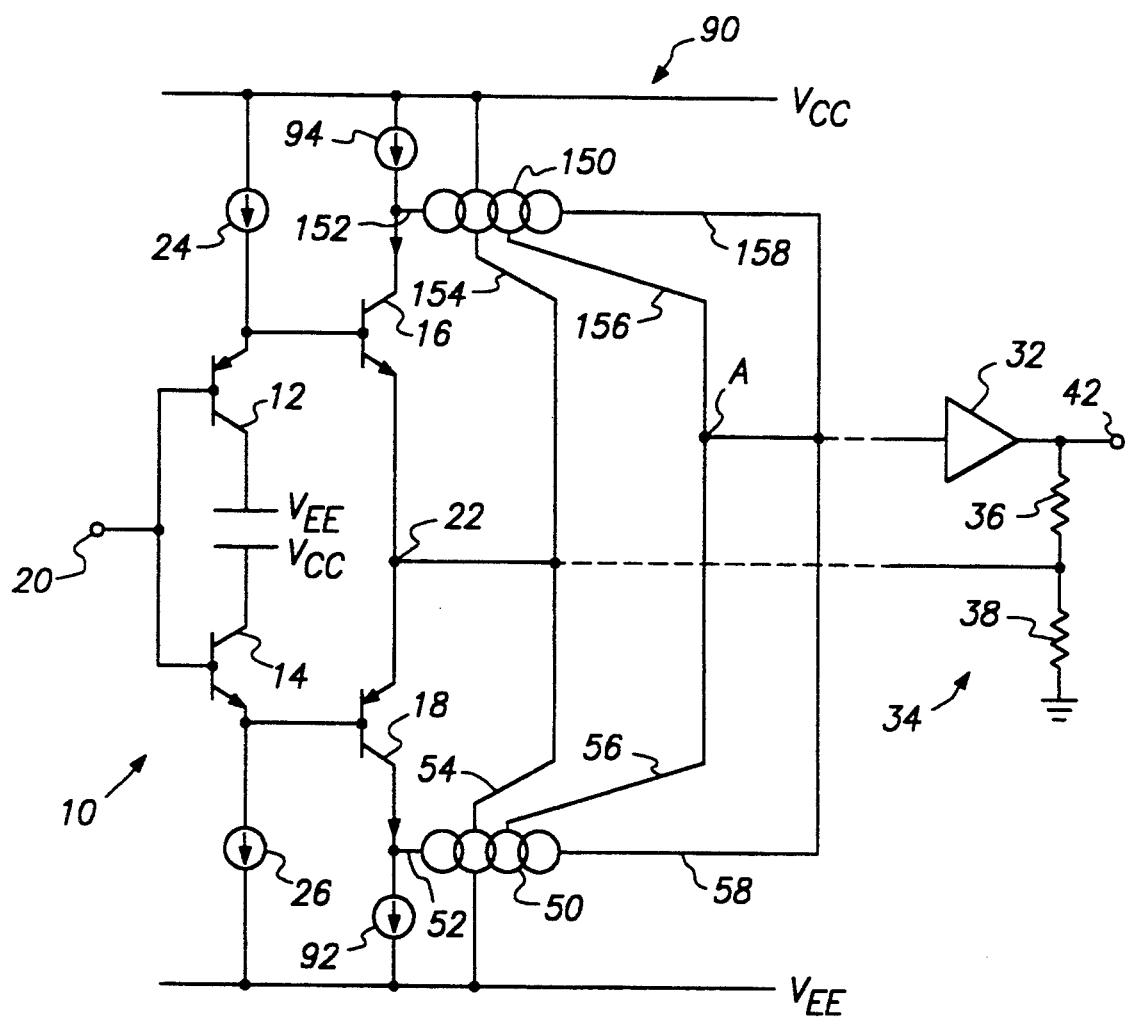
FIG. 6 is a schematic diagram of a low power, low input resistance amplifier stage in accordance with the present invention.

Referring now to FIG. 6, there is shown a schematic diagram of an amplifier stage 90 in which current sources 92, 94 have been added to the current input nodes 52, 152 of current mirrors 50, 150, respectively. Thus, current source 92 is connected between the collector of transistor 18 and voltage supply $V_{EE}$. Similarly, current source 94 is connected between transistor 16 and voltage supply $V_{CC}$. With this configuration, only a portion of the collector current of transistors 16, 18 is supplied to current mirrors 150, 50, respectively. For example, with K=1/5 and a total current of approximately 2 mA, the collector current will be about 0.2 mA in transistor 18. By choosing current source 92 to sink 0.1 mA of the collector current of transistor 18, only 0.1 mA is supplied to current mirror 50. The total collector currents in transistors 74, 68 (74, 68, and 78 for amplifier stage 11) is 1.1 mA (1.6 mA), and the input resistance of inverting input 22 is unchanged. Without current sources 92, 94 the total current would be approximately 2.2 mA (3 mA), resulting in greater power dissipation.

What is claimed is:

1. A low input resistance amplifier stage comprising:
   a buffer having inverting and non-inverting inputs and a pair of current outputs, for generating current signals at the current outputs in response to a differential signal applied between the inverting and non-inverting inputs; and
   a pair of multiple output current mirrors, each multiple output current mirror comprising:
     a first transistor having a base, collector and emitter, the emitter being connected to a supply voltage through a first current scaling resistor, and the collector being connected to one of the current outputs of the buffer to form a low impedance input for the current mirror;
     a second transistor having a base, collector and emitter, the emitter being connected to the supply voltage through a second current scaling resistor and the collector being connected to the inverting input of the buffer through a first isolating transistor to form a high impedance output of the current mirror for providing a feedback current to the inverting input, depending on the ratio of the resistances of the first and second current scaling resistors; and
     a third transistor having a base, collector and emitter, the emitter being connected to the supply voltage through a third current scaling resistor, the base being connected to the bases of the first and second transistors, and the collector being connected to the base and to a high gain node of the amplifier stage through a second isolating transistor to form a high impedance output of the current mirror for providing an output current to the high gain node, depending on the ratio of the resistances of the first and third current scaling resistors.

2. A low input resistance amplifier stage in accordance with claim 1, wherein the ratio of the resistances of the first and second current scaling resistors is K:1 and K is less than 1, and the ratio of the resistances of the first and third current scaling resistors is K:N and N is at least 1.

3. A low input resistance amplifier stage in accordance with claim 2, wherein K is between 0.1 and 1 and N is between 1 and 3.

4. A low input resistance amplifier stage in accordance with claim 1, wherein each of the multiple output current mirrors includes a fourth transistor having a base, collector and emitter, the emitter being connected to the supply voltage through a fourth current scaling resistor, the collector being connected to the high gain node through a third isolating transistor, and the base being connected to the base of the third transistor, for providing additional current to the high gain node.

5. A low input resistance amplifier stage in accordance with claim 4, wherein the resistances of the first, second, third, and fourth current scaling resistors are in the ratio of K:1:1:K.

6. A low input resistance amplifier stage in accordance with claim 4, wherein a current source is connected between each of the current outputs of the buffer and the corresponding supply voltage, for diverting a preselected amount of the current signal generated by the buffer from the collector of the first transistor of the corresponding current mirror.

7. A low input resistance amplifier stage in accordance with claim 1, wherein a current source is connected between each of the current outputs of the buffer and the corresponding supply voltage, for diverting a preselected amount of the current signal generated by the buffer from the collector of the first transistor of the corresponding current mirror.

* * * * *